United States Patent
Takagi et al.

(10) Patent No.: US 9,967,503 B2
(45) Date of Patent: May 8, 2018

(54) CHARGE-COUPLED DEVICE, MANUFACTURING METHOD THEREOF, AND SOLID-STATE IMAGING ELEMENT

(71) Applicant: HAMAMATSU PHOTONICS K.K., Hamamatsu-shi, Shizuoka (JP)

(72) Inventors: Shin-ichiro Takagi, Hamamatsu (JP); Yasuhito Yoneta, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days. days.

(21) Appl. No.: 15/033,408

(22) PCT Filed: Oct. 31, 2014

(86) PCT No.: PCT/JP2014/079141
§ 371 (c)(1),
(2) Date: Apr. 29, 2016

(87) PCT Pub. No.: WO2015/068668
PCT Pub. Date: May 14, 2015

(65) Prior Publication Data
US 2016/0286147 A1    Sep. 29, 2016

(30) Foreign Application Priority Data

Nov. 5, 2013  (JP) .................................. 2013-229743

(51) Int. Cl.
*H04N 5/378*    (2011.01)
*H01L 27/146*   (2006.01)
(Continued)

(52) U.S. Cl.
CPC ....... *H04N 5/378* (2013.01); *H01L 27/14685* (2013.01); *H01L 27/14812* (2013.01);
(Continued)

(58) Field of Classification Search
None
See application file for complete search history.

(56) References Cited

U.S. PATENT DOCUMENTS 5,793,070 A * 8/1998 Burke ................. H01L 29/1062
257/219
6,465,820 B1  10/2002 Fox
(Continued)

FOREIGN PATENT DOCUMENTS

JP    S61-49472 A    3/1986
JP    H06-283704 A    10/1994
(Continued)

OTHER PUBLICATIONS

International Preliminary Report on Patentability dated May 19, 2016 for PCT/JP2014/079141.

*Primary Examiner* — Timothy J Henn
(74) *Attorney, Agent, or Firm* — Drinker Biddle & Reath LLP

(57) ABSTRACT

Each pixel region PX includes a photoelectric conversion region S1, a resistive gate electrode R, a first transfer electrode T1, a second transfer electrode T2, a barrier region B positioned directly beneath the first transfer electrode T1 in a semiconductor substrate 10, and a charge accumulation region S2 positioned directly beneath the second transfer electrode T2 in the semiconductor substrate 10. An impurity concentration of the barrier region B is lower than an impurity concentration of the charge accumulation region S2, and the first transfer electrode T1 and the second transfer electrode T2 are electrically connected to each other.

4 Claims, 20 Drawing Sheets

(51) Int. Cl.
    *H01L 27/148*    (2006.01)
    *H04N 5/225*     (2006.01)
(52) U.S. Cl.
    CPC .. *H01L 27/14825* (2013.01); *H01L 27/14837* (2013.01); *H04N 5/2253* (2013.01)

(56)            References Cited

U.S. PATENT DOCUMENTS

| | | | |
|---|---|---|---|
| 2002/0100887 A1* | 8/2002 | Hagiwara | H01L 27/14812 250/586 |
| 2004/0195577 A1* | 10/2004 | Yamada | H01L 27/14831 257/79 |
| 2010/0045841 A1* | 2/2010 | Otsuka | H01L 27/14601 348/314 |
| 2011/0050971 A1* | 3/2011 | Takatsuka | H01L 27/14812 348/311 |
| 2013/0270609 A1 | 10/2013 | Takagi et al. | |
| 2013/0285188 A1 | 10/2013 | Ikeya et al. | |

FOREIGN PATENT DOCUMENTS

| | | |
|---|---|---|
| JP | H07-235656 A | 9/1995 |
| JP | H08-195485 A | 7/1996 |
| JP | H11-32166 A | 2/1999 |
| JP | 2004-303982 A | 10/2004 |
| JP | 2009-302348 A | 12/2009 |
| JP | 2012-151364 A | 8/2012 |
| WO | WO-2008/066067 A1 | 6/2008 |
| WO | WO 2013/125631 | 8/2013 |

* cited by examiner

*Fig.5*

|  | RGL | RGH(>RGL) | PV |
|---|---|---|---|
| t1 | Constant | Constant | High:<br>(Charge is accumulated) |
| t2 | Constant | Constant | Low:<br>(Charge is transferred) |

*Fig.6*
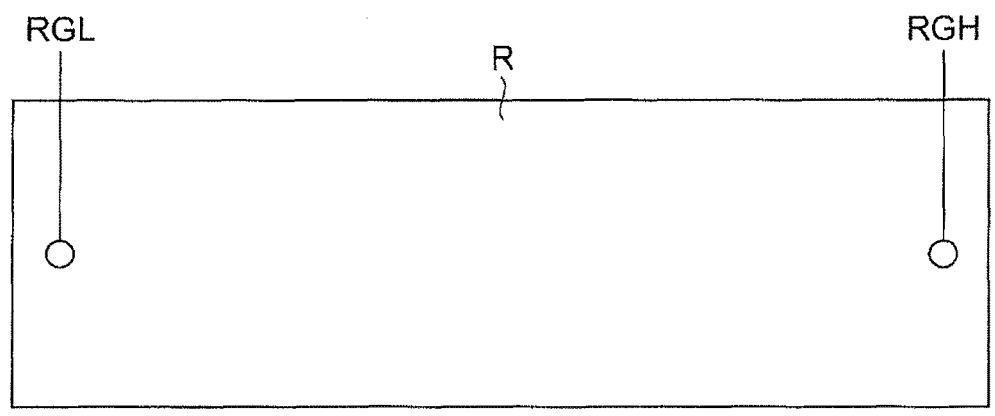
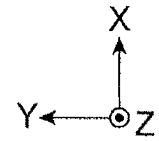

Fig.7
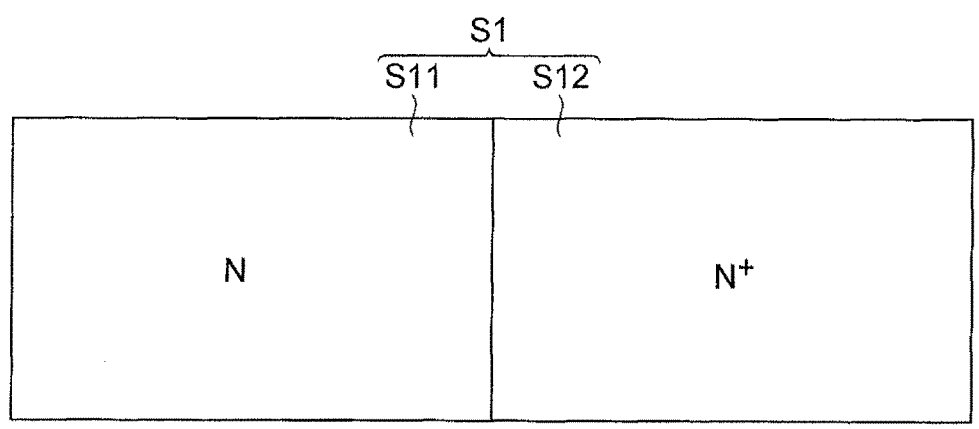
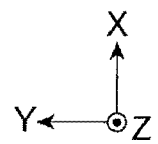

Fig.13
(A)
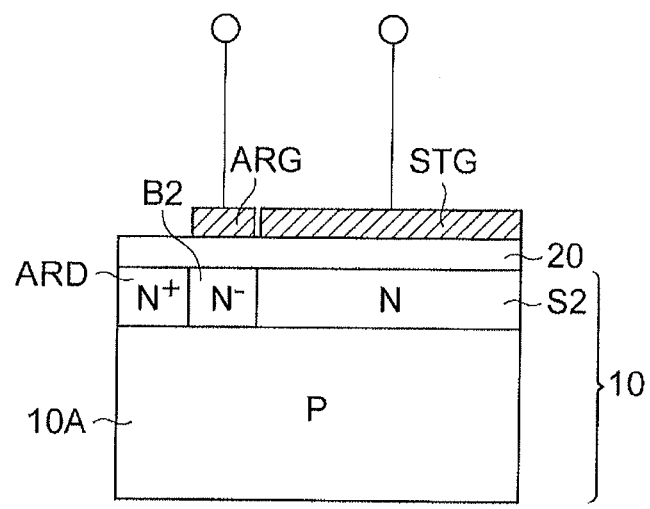
(B)
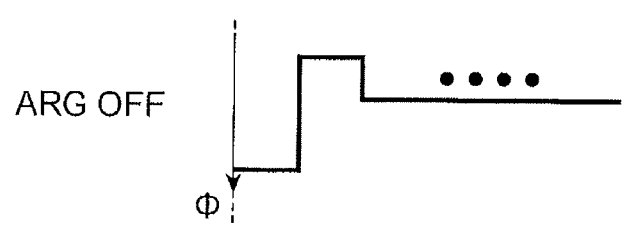
ARG OFF
(C)
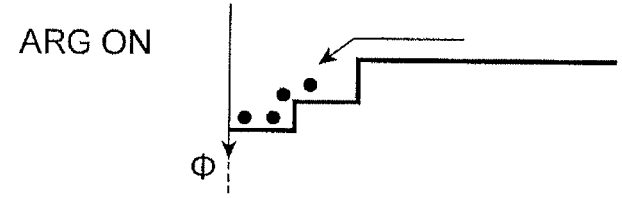
ARG ON
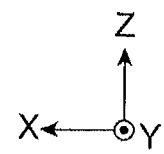

CHARGE-COUPLED DEVICE, MANUFACTURING METHOD THEREOF, AND SOLID-STATE IMAGING ELEMENT

TECHNICAL FIELD

The present invention relates to a charge-coupled device (CCD) which converts an incident energy beam (light/X-rays) into a charge (electrons) and changes potential in a semiconductor, thereby transferring a converted charge and a manufacturing method thereof, and a solid-state imaging element which includes the charge-coupled device.

BACKGROUND ART

In the related art, a solid-state imaging element which converts an incident energy beam into a charge is widely known (see Patent Literatures 1 to 3). In particular, in a charge-coupled device in a medical field and the like, a large-sized pixel is required. This is because the number of times a charge is transferred can be reduced by using the large-sized pixel.

CITATION LIST

Patent Literature

[Patent Literature 1] Japanese Unexamined Patent Publication No. 2004-303982
[Patent Literature 2] Japanese Unexamined Patent Publication No. 2012-151364
[Patent Literature 3] Japanese Unexamined Patent Publication No. H6-283704

SUMMARY OF INVENTION

Technical Problem

However, a charge-coupled device transfers a generated charge using a potential inclination referred to as a fringing electric field, but when a pixel size is large, a potential becomes flat with respect to a position in a center of a pixel, and thereby charges tend to be difficult to transfer.

The present invention is made in a view of such a problem, and aims to provide a charge-coupled device capable of converting an incident energy beam into a charge and sufficiently transferring the charge and a manufacturing method thereof, and a solid-state imaging element including the charge-coupled device.

Solution to Problem

In order to solve the problem described above, a charge-coupled device according to the present invention includes a semiconductor substrate including a plurality of pixel regions aligned in one direction, and an insulation film provided on the semiconductor substrate, in which each pixel region includes a photoelectric conversion region which performs photoelectric conversion on an incident energy beam, potential inclination forming means for forming a potential inclination which promotes transfer of charges in the one direction in the photoelectric conversion region, a first transfer electrode provided on the insulation film, a second transfer electrode provided on the insulation film and disposed between the first transfer electrode and a pixel region adjacent to the pixel region, a barrier region positioned directly beneath the first transfer electrode in the semiconductor substrate, and a charge accumulation region positioned directly beneath the second transfer electrode in the semiconductor substrate, an impurity concentration of the barrier region is lower than an impurity concentration of the charge accumulation region, and the first transfer electrode and the second transfer electrode are electrically connected to each other.

The potential inclination forming means can sufficiently transfer a charge generated in the photoelectric conversion region in one direction even when a pixel size is large. The transferred charge is transferred to the charge accumulation region through the barrier region. Potentials (potential) of the barrier region and the charge accumulation region in a non-bias state vary with an impurity concentration difference, and the charge accumulation region is deeper and is likely to accumulate a charge. On the other hand, the same potential is given to the barrier region and the charge accumulation region by the first and the second transfer electrodes which are electrically connected to each other through the insulation film. Accordingly, charges can be accumulated (first state) in the charge accumulation region through the barrier region, and the accumulated charges can be transferred (second state) to a pixel of a rear stage by raising and lowering a potential applied to the first and the second transfer electrodes.

In addition, the first transfer electrode and the second transfer electrode can be configured from one common electrode. In this case, there is an effect that a structure is simplified.

Moreover, a potential barrier region having a lower impurity concentration than the photoelectric conversion region is formed between the charge accumulation region in a pixel region and the photoelectric conversion region in a pixel region adjacent to a rear stage of the pixel region. In this manner, when a potential barrier region with a low impurity concentration is present, it is possible to prevent a charge from reversely flowing from the pixel of the rear stage to a charge accumulation region of a target pixel region.

The potential inclination forming means is positioned directly above the photoelectric conversion region and is a resistive gate electrode provided on the insulation film, and a predetermined fixed voltage is applied across both ends of the resistive gate electrode in the one direction. A potential inclination can be created in a semiconductor region directly beneath the resistive gate electrode by disposing the resistive gate electrode and applying the fixed voltage across both ends of the resistive gate electrode. Accordingly, even when a pixel of a large area is used, it is possible to sufficiently transfer a charge.

A potential can be given to the resistive gate electrode and the transfer electrode from a drive circuit. The drive circuit is controlled by a controller.

A solid-state imaging element of the present invention includes the charge-coupled device described above, a drive circuit for driving the charge-coupled device, and a controller for controlling the drive circuit, in which the controller controls the drive circuit so that potentials of the first and the second transfer electrodes vertically vibrate at the same time. In this case, it is possible to alternately create the first state and the second state described above by raising and lowering the potentials.

In addition, in a method of manufacturing the charge-coupled device including the common electrode, the barrier region is formed by adding impurities which form the photoelectric conversion region to a surface of the semiconductor substrate, and performing a carrier compensation by partially adding impurities of a conductivity type opposite to the semiconductor region which is formed by the addition. The barrier region with a low concentration can be easily formed by performing the carrier compensation.

Advantageous Effects of Invention

According to the charge-coupled device and the solid-state imaging element of the present invention, it is possible to convert an incident energy beam into a charge and then sufficiently transfer the charge, and by using the manufacturing method thereof, it is possible to easily manufacture a portion of the barrier region.

BRIEF DESCRIPTION OF DRAWINGS

FIG. 5 is a chart which shows a potential change in each signal.

FIG. 6 is a plan view of a resistive gate electrode.

FIG. 7 is a plan view of a photoelectric conversion region of a first embodiment.

FIG. 13 is a cross-sectional view (A-A arrow cross-section) (FIG. 13(A)) of the charge-coupled device shown in FIG. 12, and potential views of the cross section in an X axis direction (FIGS. 13(B) and 13(C)).

DESCRIPTION OF EMBODIMENTS

Figure 1:
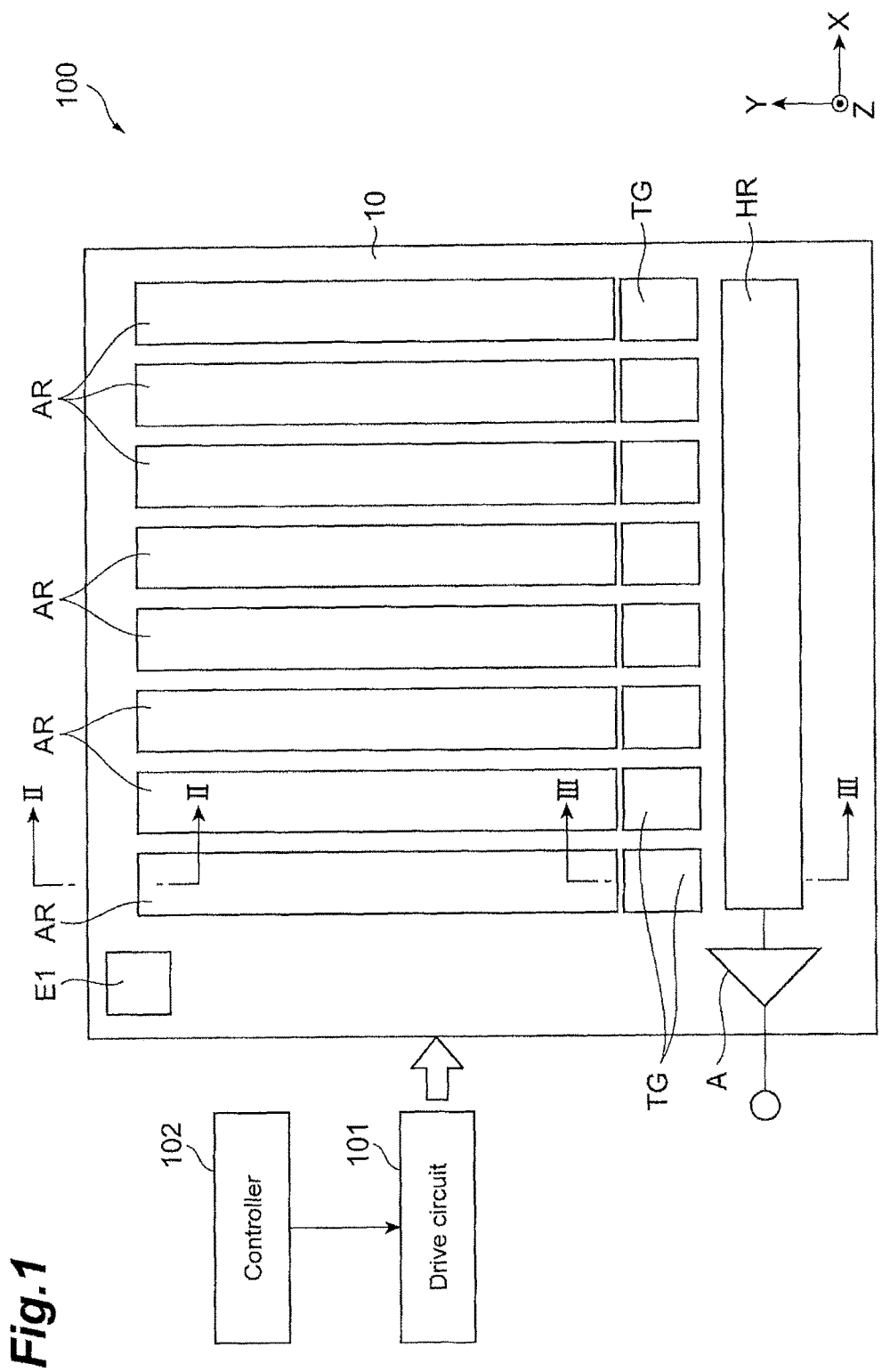
FIG. 1 is a view which shows a plan configuration of a solid-state imaging element including a charge-coupled device.

Hereinafter, a charge-coupled device and a manufacturing method thereof according to an embodiment, and a solid-state imaging element including the charge-coupled device will be described. The same element will be denoted by the same reference numerals and overlapping description will be omitted.

First, a premise leading to the present invention will be described. A behavior of electrons generated by an incident energy beam (light/X-rays, and the like) in one pixel in a charge-coupled device (CCD) is investigated. Hereinafter, a two-phase drive type CCD is generally described as a configuration of the CCD. A pixel includes a barrier region and a charge accumulation region. The barrier region and the charge accumulation region compose a pair, and a common bias is given thereto. A potential of the barrier region is shallower than a potential of the charge accumulation region under the same bias. One pixel is configured by two pairs of the barrier region and the charge accumulation region.

Figure 20:
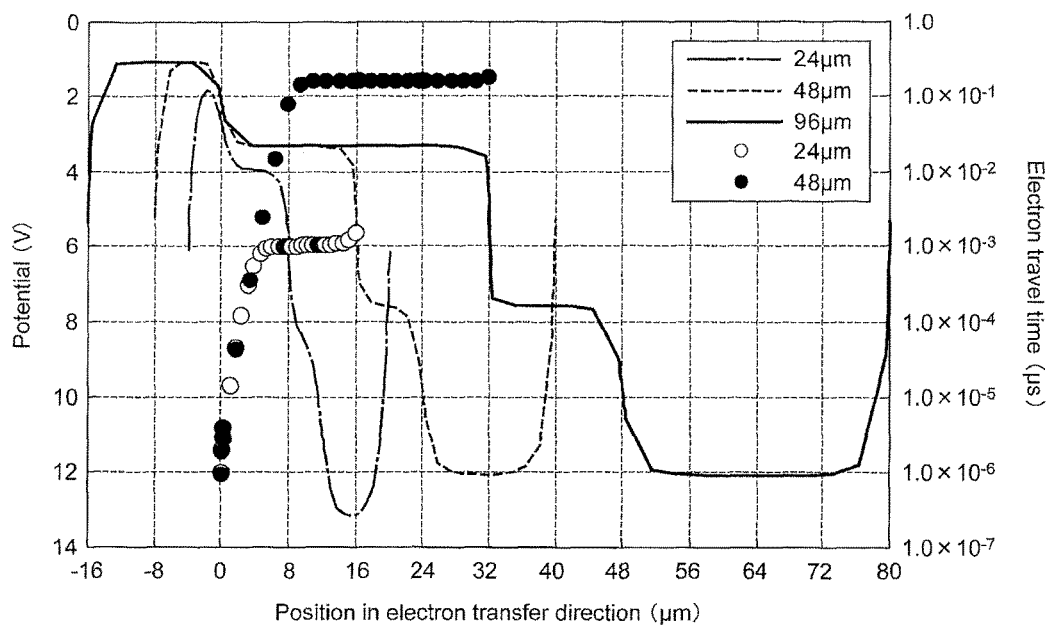
FIG. 20 is a graph which shows a relationship between a position ($\mu$m) in an electron transfer direction and a potential (V) and an electron travel time ($\mu$s).

FIG. 20 is a graph which shows a relationship between a position ($\mu$m) in an electron transfer direction and a potential (V) and an electron travel time ($\mu$s).

When sizes of a square type pixel are 24 $\mu$m, 48 $\mu$m, and 96 $\mu$m, a potential distribution is provided as shown by lines of drawings. A region in which a growth potential in a negative direction is substantially increased upward from a position at a point of 0 $\mu$m is a first barrier region, a region in which a potential extends in a positive direction from the position at a point of 0 $\mu$m and is substantially flat is a first charge accumulation region, a region in which a potential is increased downward to be substantially flat is a second barrier region, and in addition, a region in which a subsequent potential forms a well is a second charge accumulation region. The first charge accumulation region and the first barrier region are given a first common bias, and the second charge accumulation region and the second barrier region are given a second common bias. Since a potential is inclined near a boundary of each region, a fringing region is formed. In FIG. 20, a larger voltage is given to a second bias than a first bias, and a charge of the first charge accumulation region is transferred to the second charge accumulation region through the second barrier region. A larger voltage is given to the first bias than the second bias, and thereby charges accumulated in the second charge accumulation region are transferred to the first charge accumulation region through the first barrier region of a pixel adjacent to the second charge accumulation region. By repeating this operation, charge transfer across a plurality of pixels is performed.

When a pixel size is 24 $\mu$m, electrons generated at a position of 0 $\mu$m which is an end of the first charge accumulation region reaches the second charge accumulation region after $1 \times 10^{-3}$ ($\mu$s). When the pixel size is 48 $\mu$m, an electron generated at the position of 0 $\mu$m reaches the second charge accumulation region after $1.2 \times 10^{-1}$ ($\mu$s). On the other hand, when the pixel size is 96 $\mu$m, electrons generated at the position of 0 $\mu$m does not reach the second charge accumulation region because a region in which a potential is flat is too large.

Therefore, in the charge-coupled device according to the present embodiment, most pixels are configured to form an inclined potential. Several means for forming an inclined potential may be considered, but it is preferable to dispose a resistive gate electrode on a photoelectric conversion region through an insulation film.

In a case of using the resistive gate electrode, when the pixel size is 24 $\mu$m, 48 $\mu$m, or 96 $\mu$m, minimum values of an electric field intensity in each pixel are 63 (V/nm), 41 (V/nm), and 18 (V/nm). When the pixel size is 24 $\mu$m, 48 $\mu$m, or 96 $\mu$m, minimum values of an electric field intensity in each pixel in a two-phase driving CCD which does not use the resistive gate electrode are 28 (V/nm), 1.2 (V/nm), and 0 (V/nm). Therefore, it is known that the electric field intensity can be increased when the resistive gate electrode is used compared to when it is not used. A result in a case of a two-phase driving CCD is a result of a case in which a length ratio of a barrier region to a charge accumulation region is set to be 1:2, and when the resistive gate electrode is used, the result is a result of a case in which a length of the barrier region is set to be 4 μm and a length of the charge accumulation region is set to be 8 μm.

Hereinafter, a charge-coupled device according to the embodiment will be described in detail.

Figure 2:
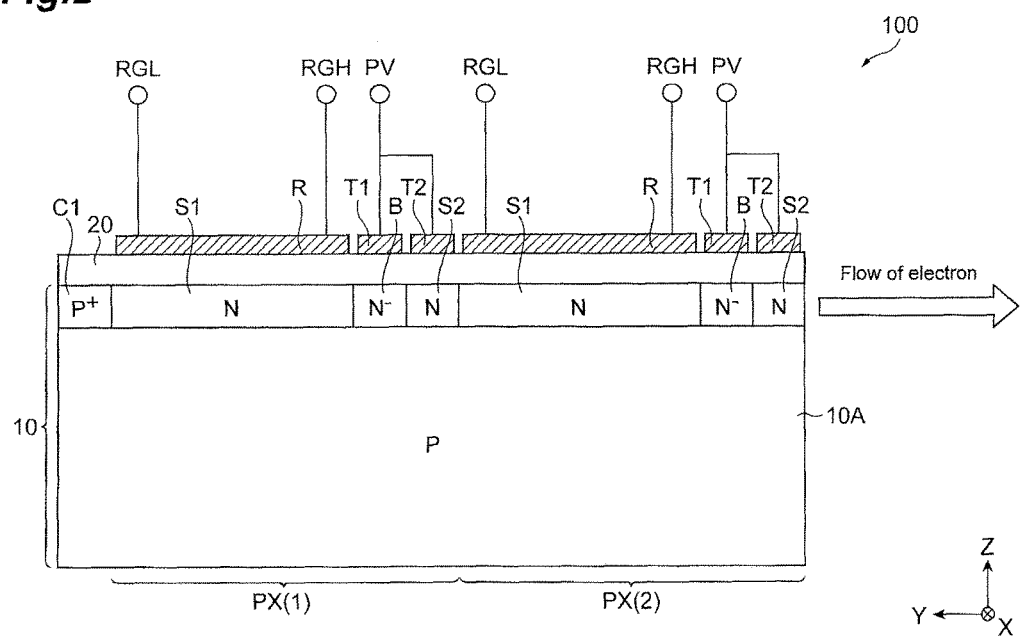
FIG. 2 is a cross-sectional view (II-II arrow cross-section) of the charge-coupled device shown in FIG. 1.

FIG. 1 is a view which shows a plan configuration of a solid-state imaging element including a charge-coupled device. FIG. 2 is a cross-sectional view (II-II arrow cross-section) of the charge-coupled device shown in FIG. 1.

As shown in FIG. 2, the charge-coupled device 100 includes a semiconductor substrate 10 having a plurality of pixel regions PX (represented by PX(1) and PX(2) in FIG. 2) aligned in a Y axis direction (one direction), and an insulation film 20 provided on the semiconductor substrate 10. A contact region C1 having added impurities (P-type) with a higher concentration than a semiconductor substrate main body 10A is formed on a surface side of a P-type (first conductivity type) semiconductor substrate 10, and an electrode E1 (refer to FIG. 1) is in contact with the contact region C1 to be electrically connected. A plurality of pixel columns AR which configure a two-dimensional imaging region are formed on a surface side of the semiconductor substrate 10, and each pixel column includes a plurality of pixel regions PX aligned in the Y direction. The contact region C1 may be formed so as to surround an outer edge of the semiconductor substrate 10.

As shown in FIG. 1, a transfer gate electrode TG for controlling a passage of electrons is provided at a terminal portion of each pixel column AR, and a horizontal register HR is disposed through the transfer gate electrode TG. The horizontal register HR transfers electrons flowing therein in a horizontal direction (X-axis negative direction) through the transfer gate electrode TG. The transferred electrons are input into an amplifier A, is converted into a voltage, and output to the outside.

As shown in FIG. 2, each pixel region PX includes a photoelectric conversion region S1 (PN junction with a spread depletion layer is formed at an interface between the semiconductor substrate main body 10A and the photoelectric conversion region S1) for performing photoelectric conversion on an incident energy beam, and a resistive gate electrode R (potential inclination forming means) for forming potential inclination in one direction in the photoelectric conversion region S1. In addition, each pixel region PX includes a first transfer electrode T1 provided on the insulation film 20, and a second transfer electrode T2 which is provided on the insulation film 20 and disposed between the first transfer electrode T1 and a pixel region PX(2) adjacent to a pixel region PX(1) thereof. Moreover, each pixel region PX includes a barrier region B positioned directly beneath the first transfer electrode T1 in the semiconductor substrate 10 and a charge accumulation region S2 positioned directly beneath the second transfer electrode T2 in the semiconductor substrate 10.

Here, an impurity concentration (second conductivity type: N-type) of the barrier region B is lower than an impurity concentration of the charge accumulation region S2, and the first transfer electrode T1 and the second transfer electrode T2 are electrically connected to each other.

In the embodiment, potential inclination forming means is positioned directly above the photoelectric conversion region S1 and is a resistive gate electrode R provided on the insulation film 20, and a predetermined fixed voltage is applied across both ends of the resistive gate electrode R in the Y axis direction from a drive circuit 101, but the potential inclination forming means can be configured even if a two-dimensional concentration distribution of a semiconductor substrate surface is used as described above. The potential inclination forming means promotes a transfer of charges in a charge transfer direction.

When the resistive gate electrode R is used, the resistive gate electrode R is disposed on the insulation film 20 and a fixed voltage is applied across both ends of the resistive gate electrode, and thereby it is possible to create a potential inclination in a semiconductor region directly beneath the resistive gate electrode. Here, a potential RGL is added to a front stage in an electron transfer direction in the resistive gate electrode R, and a potential RGH (>RGL) is added to a rear stage. In other words, the potentials RGL and RGH are applied between the resistive gate electrode and a ground, respectively. The rear stage side has a higher potential, such that an electron having a negative charge flows toward the rear stage with a higher potential. Accordingly, even when a pixel having a large area is used, it is possible to sufficiently transfer a charge.

Even when a pixel size is large, it is possible to sufficiently transfer a charge generated in the photoelectric conversion region S1 in one direction using the resistive gate electrode R. The transferred charge is transferred to the charge accumulation region S2 through the barrier region B. A potential in a non-bias state of the barrier region B and the charge accumulation region S2 varies with an impurity concentration difference, and the charge accumulation region S2 is deeper and easily accumulates a charge. ON the other hand, the same bias is applied to the barrier region B and the charge accumulation region S2 through the insulation film by the first transfer electrode T1 and the second transfer electrode T2 electrically connected to each other. Accordingly, it is possible to accumulate (a first state) a charge in the charge accumulation region S2 through the barrier region B and to transfer (a second state) the accumulated charge to a pixel at a rear stage by raising or lowering a potential (transfer signal PV) applied to the first transfer electrode T1 and the second transfer electrode T2.

It is possible to apply a potential to the resistive gate electrode R and the transfer electrodes T1 and T2 from the drive circuit 101. The drive circuit 101 is controlled by a controller 102. The controller 102 is configured from a microcomputer or the like, and sends a clock signal which is programmed in advance to the drive circuit 101 according to a control input into the controller 102. When a predetermined clock signal is input to the drive circuit 101, the drive circuit 101 generates constant voltages RGL and RGH and a one-phase transfer signal PV. For example, the drive circuit 101 detects an input start of a clock signal, generates the constant voltage RGL and RGH during a certain period of time, divides the clock signal when needed, raises a potential of the transfer signal PV at a rising timing of the divided clock signal, and lowers the potential of the transfer signal PV at a falling timing.

That is, the solid-state imaging element includes the charge-coupled device 100, the drive circuit 101 for driving the charge-coupled device 100, and the controller 102 for controlling the drive circuit 101, and the controller 102 controls the drive circuit 101 so that potentials of the first transfer electrode T1 and the second transfer electrode T2 vertically vibrate at the same time by an application of the transfer signal PV. In this case, it is possible to alternately create "the first state" and "the second state" described above by raising or lowering a potential.

Figure 3:
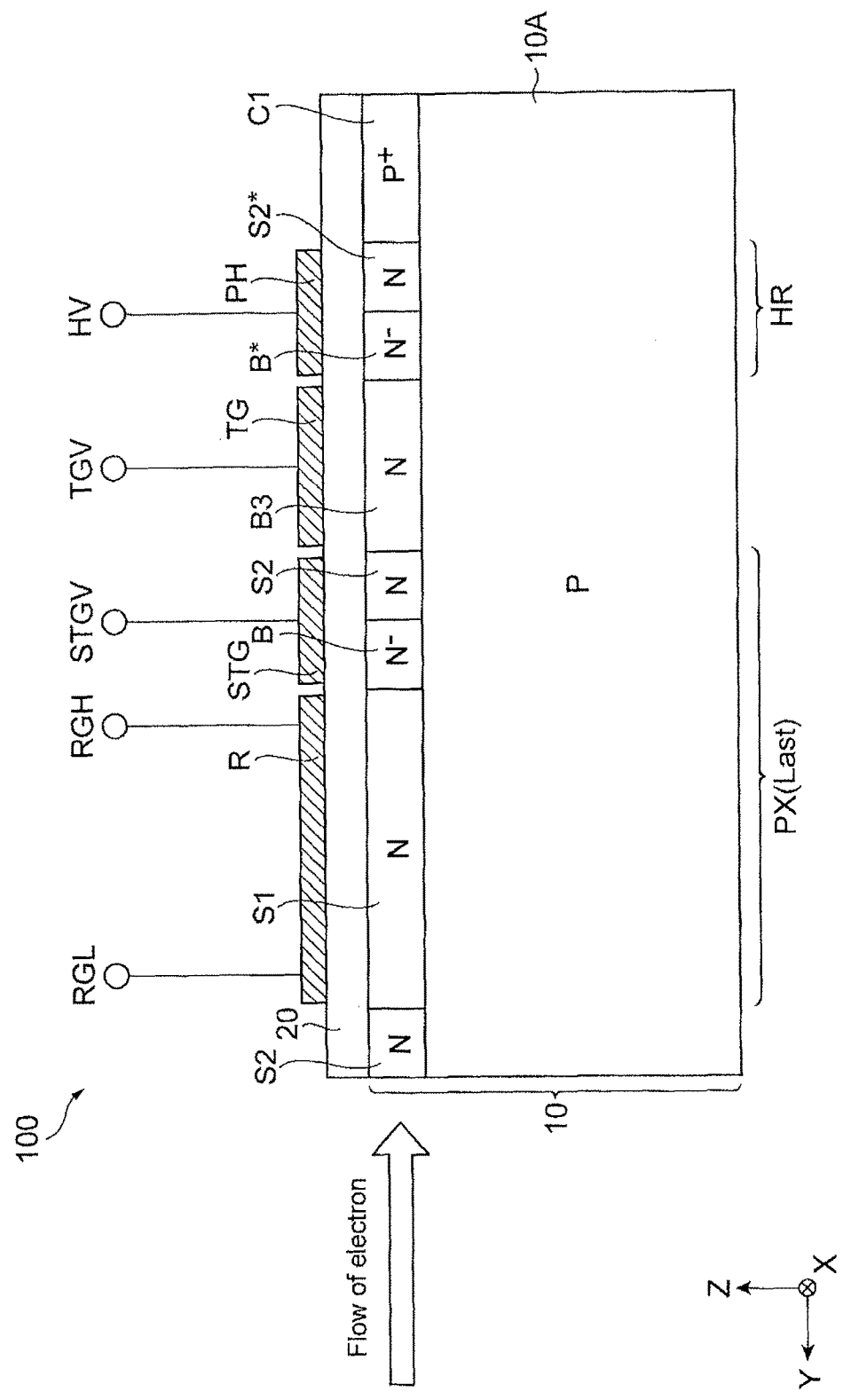
FIG. 3 is a cross-sectional view (III-III arrow cross-section) of the charge-coupled device shown in FIG. 1.

FIG. 3 is a cross-sectional view (III-III arrow cross-section) of the charge-coupled device shown in FIG. 1.

Electrons transferred to a last pixel region PX (last) of a pixel column in a vertical direction are accumulated in a last barrier region B and a last charge accumulation region S2. A common transfer electrode STG is disposed on the last barrier region B and the last charge accumulation region S2 through the insulation film 20, but this may be also separated. An N-type channel region B3 is provided adjacent to the last charge accumulation region S2, and the transfer gate electrode TG is disposed on the channel region 133 through the insulation film 20. The transfer gate electrode TG controls charge transfer to the horizontal register HR and a gate clock signal TGV is applied thereto. The clock signal TGV may be the same as the clock signal PV, and may be set to perform a binning operation.

When a gate is opened by applying a potential higher than a reference value to the transfer gate electrode TG, charges accumulated in the last pixel region PX (last) flow into a semiconductor region formed directly beneath a transfer electrode PH for a horizontal register through the channel region B3. The semiconductor region is made of a barrier region B* and a charge accumulation region S2*, and they can be configured to be the same as the barrier region B and the charge accumulation region S2, respectively.

Charges accumulated in the charge accumulation region S2* of the horizontal register HR are transferred in a horizontal direction by applying a horizontal transfer signal to a horizontal transfer electrode PH provided on the insulation film 20, but the transfer signal and a transfer signal applied to the transfer gate electrode TG are also generated by the drive circuit 101 according to an instruction of the controller 102.

Figure 4:
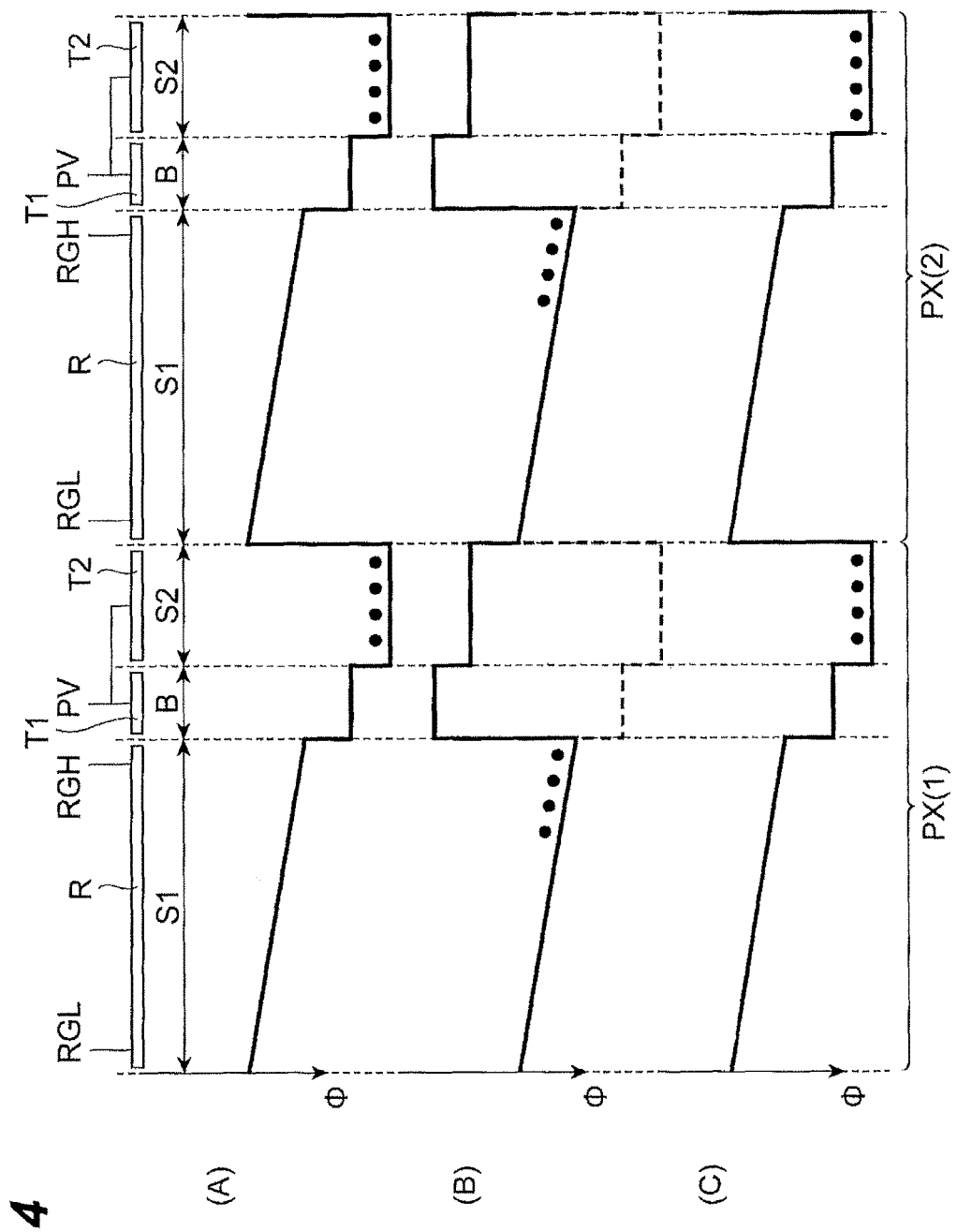
FIG. 4 is a view for describing a potential change in a vertical pixel column.

FIG. 4 is a view for describing a potential change in a vertical pixel column. FIG. 5 is a chart which shows a potential change in each signal. In addition, a potential is represented by φ, and a downward direction in the drawing is a positive direction in a following graph.

In all periods t1 to t2 (refer to FIG. 5) in which charge transfer is performed, the potentials RGL and RGH applied to both ends of the resistive gate electrode R are constant (representing each voltage with the ground). Of course, charge transfer may be performed in a photoelectric conversion region while performing a photoelectric conversion after the potentials RGL and RGH are applied, but electrons may be accumulated without applying a voltage across both ends of the resistive gate electrode R during the photoelectric conversion, and thereafter, a voltage may be given only during the charge transfer.

In a first period t1, as shown in (A) of FIG. 4, a potential of the photoelectric conversion region S1 disposed in the resistive gate electrode R becomes deeper toward a transfer direction (right side of the drawing: the Y-axis negative direction in FIG. 1) of electrons (black circles), a potential of the barrier region B directly beneath the first transfer electrode T1 becomes largely deeper, and becomes far deeper in the charge accumulation region S2 directly beneath the second transfer electrode T2. The charge accumulation region S2 is superimposed between an adjacent barrier region B and an adjacent photoelectric conversion region S1 of a rear stage, and forms a potential well. In a state of (A), a potential higher than the reference value is added to both the first transfer electrode T1 and the second transfer electrode T2 by a transfer signal PV.

In a second period t2, as shown in (B) of FIG. 4, there is no change in a potential of the photoelectric conversion region S1 disposed in the resistive gate electrode R, but a potential of the barrier region B directly beneath the first transfer electrode T1 is smaller than the potential of the photoelectric conversion region S1, and thereby a potential barrier is configured. Since a potential of the charge accumulation region S2 is deeper than a potential of the barrier region B, and is shallower than a potential of the photoelectric conversion region S1 of a rear stage, electrons accumulated in the charge accumulation region S2 flow in the photoelectric conversion region of a rear stage, but the electrons are blocked by the potential barrier formed by the barrier region B (buffer region) and are temporarily accumulated at a right end of the drawing of the photoelectric conversion region S1.

Thereafter, operations in the first period t1 and the second period t2 are repeated. That is, the first period t1 is repeated after the period of (B) of FIG. 4. In this case, as shown in (C) of FIG. 4, there is no change in the potential of the photoelectric conversion region S1 disposed in the resistive gate electrode R, but the potentials of the barrier region B and the photoelectric conversion region S1 are changed to be the same as in the first period t1, and the same operation as in the first period is performed. Moreover, in a next period, the potentials of the barrier region B and the photoelectric conversion region S1 are changed to be the same as in the second period t2, and the same operation as in the second period is performed.

Next, potential inclination forming means will be described.

FIG. 6 is a plan view of a resistive gate electrode as the potential inclination forming means. The resistive gate electrode R is made of a poly-silicon having lower resistivity than, for example, the photoelectric conversion region S1. An appropriate resistance value across both ends of a resistor R can be set to be 1 kΩ to 10 MΩ. The resistive gate electrode R configures a rectangle in an XY plane, but can be another polygonal shape such as a trapezoid. The potentials RGL and RGH are given to both ends of the resistive gate electrode R, and a potential inclination which promotes charge transfer in the charge transfer direction is formed.

FIG. 7 is a plan view of a photoelectric conversion region of a first embodiment as potential inclination forming means. That is, the same potential inclination is formed by changing an impurity concentration of the photoelectric conversion region S1 without using the resistive gate electrode R described above in the embodiment. Electrons are transferred in a right direction of the drawing, but an impurity concentration of a rear stage side region S12 of the charge transfer is set to be higher than an impurity concentration of a front stage side region S11 of the charge transfer. Even in this case, a potential of the rear stage side region S12 is deeper than a potential of the front stage side region S11, an inclined fringing electric field is formed in a vicinity of the boundary of the front stage side region S11 and rear stage side region S12. That is, a potential inclination which promotes charge transfer in a charge transfer direction is formed.

Figure 8:
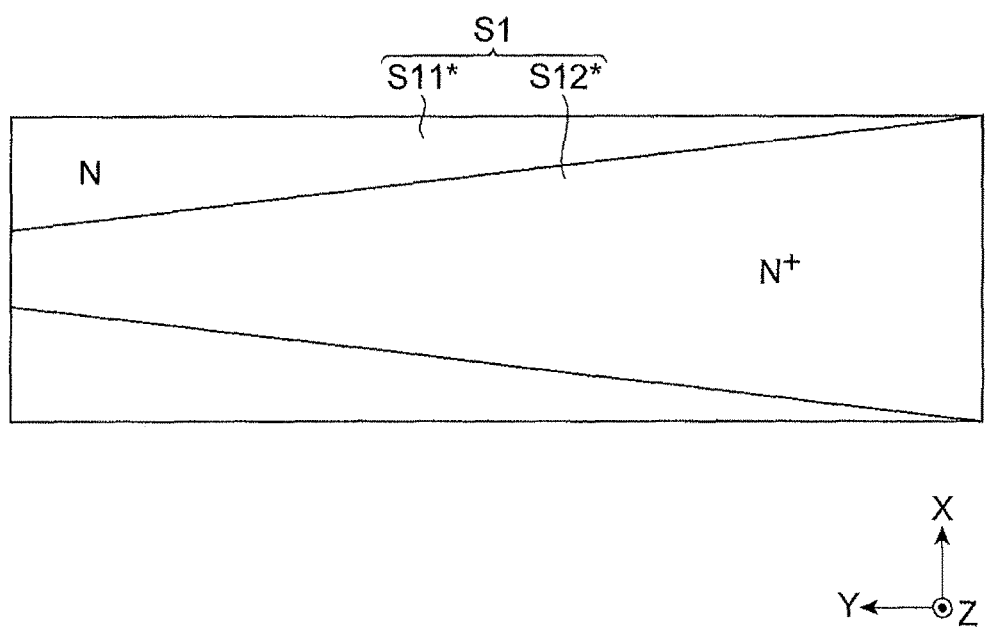
FIG. 8 is a plan view of a photoelectric conversion region of a second embodiment.

FIG. 8 is a plan view of a photoelectric conversion region of a second embodiment as potential inclination forming means. That is, in the embodiment, the same potential inclination is also formed by changing the impurity concentration of the photoelectric conversion region S1 without using the resistive gate electrode R described above. Electrons are transferred in a right direction of the drawing, but a trapezoidal taper region S12* whose width in an X axis direction is narrowed toward a direction opposite to the charge transfer direction (Y direction) extends so as to cross a remaining photoelectric conversion region S11* in the Y axis direction. The impurity concentration of the taper region S12* is set to be higher than the impurity concentration of the photoelectric conversion region S11*. Even in this case, an average potential of the width direction in the rear stage side region of the charge transfer direction is deeper than in the front stage side region, and a potential inclination which promotes charge transfer in the charge transfer direction is formed in the photoelectric conversion region S1.

Figure 9:
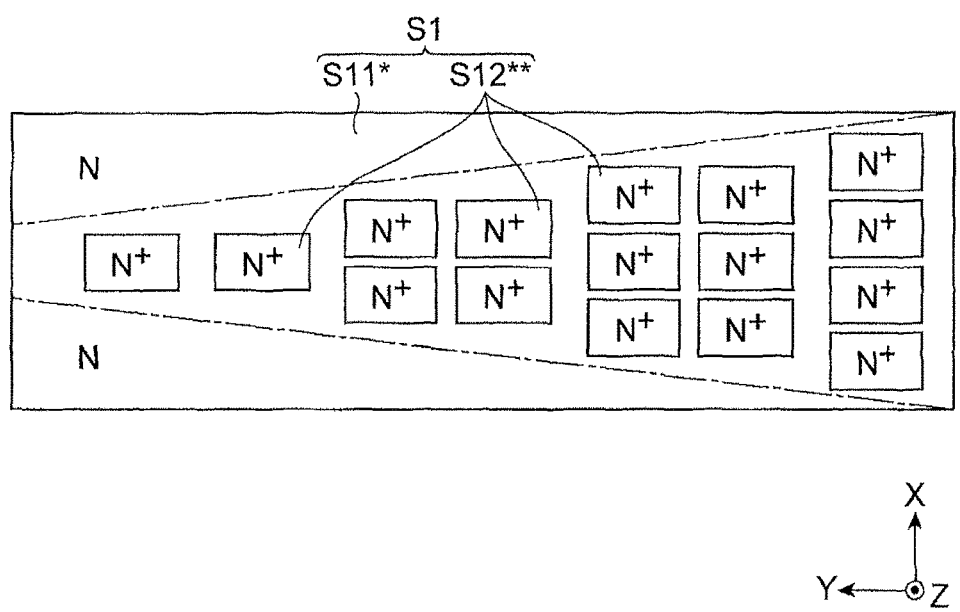
FIG. 9 is a plan view of a photoelectric conversion region of a third embodiment.

FIG. 9 is a plan view of a photoelectric conversion region of a third embodiment as potential inclination forming means. That is, in the embodiment, the same potential inclination is formed by changing the impurities of the photoelectric conversion region without using the resistive gate electrode R described above. In the photoelectric conversion region S1 of the embodiment, the taper region S12* in the second embodiment is replaced with a plurality of micro semiconductor regions S12, and a shape of each of the micro semiconductor regions S12 is a polygon such as a rectangle, but a maximum value of a distance between both ends of the plurality of micro semiconductor regions S12** in a width direction (X axis direction) is smaller toward a direction (Y-axis positive direction) opposite to the charge transfer direction.

The impurity concentration of the micro semiconductor regions S12** is set to be higher than the impurity concentration of the remaining photoelectric conversion region S11*. Even in this case, an average potential of the width direction in the rear stage side region of the charge transfer direction is deeper than in the front stage side region, and a potential inclination which promotes a transfer of charges in the charge transfer direction is formed in the photoelectric conversion region S1.

Figure 10:
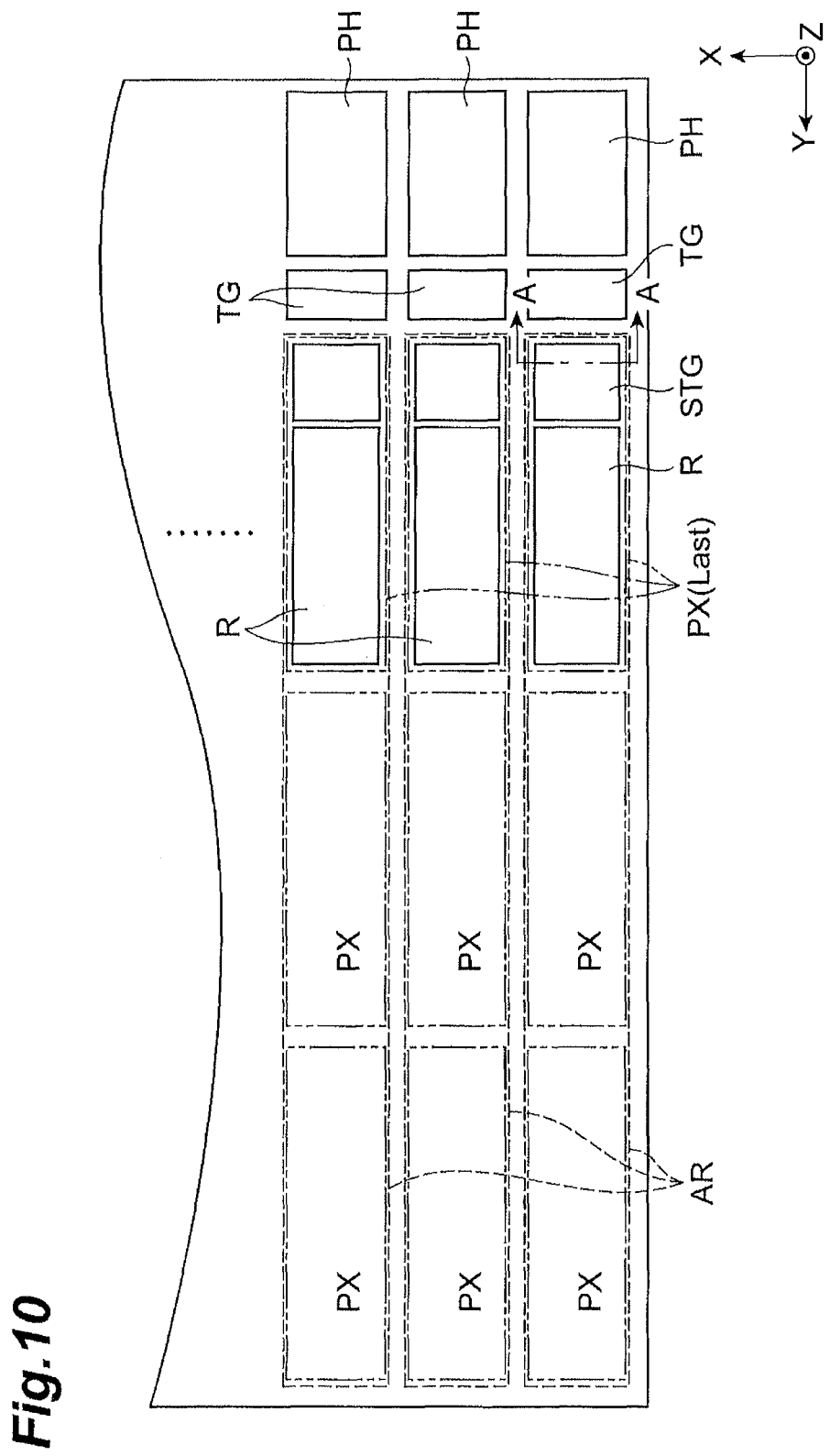
FIG. 10 is a partial plan view of the charge-coupled device for describing a terminal portion of the vertical pixel column.
Figure 11:
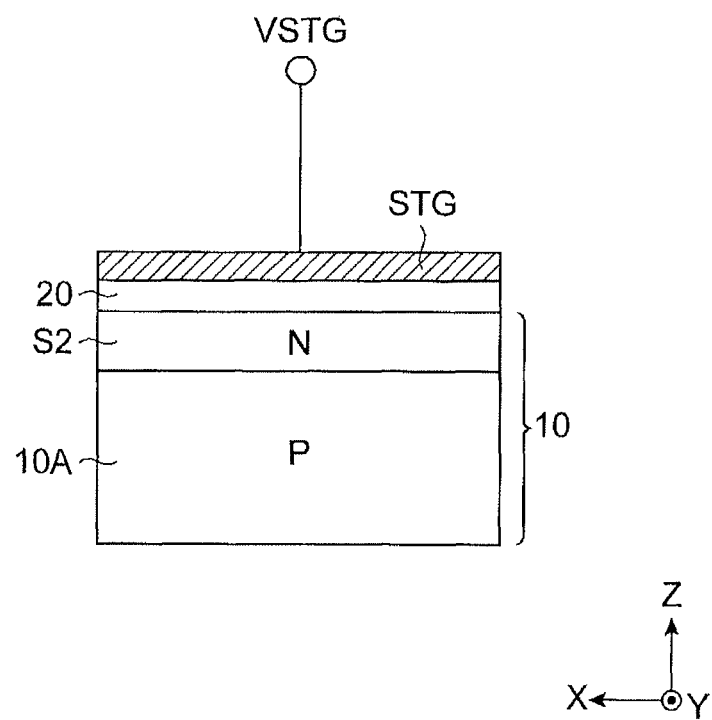
FIG. 11 is a cross-sectional view (A-A arrow cross-section) of the charge-coupled device shown in FIG. 10.

FIG. 10 is a partial plan view of the charge-coupled device for describing a terminal portion of the vertical pixel column, and FIG. 11 is a cross-sectional view (A-A arrow cross-section) of the charge-coupled device shown in FIG. 10.

The transfer electrode STG, the transfer gate electrode TG, and the horizontal transfer electrode PH described above are sequentially formed at a terminal of a pixel column made of a plurality of pixel regions PX in the negative direction of the Y-axis. In this configuration, the charge accumulation region S2 configures an N-type semiconductor layer uniformly spreading in the X axis direction, and thereby there is a problem that it is not possible to discharge a charge directly beneath the transfer electrode STG at a desired timing.

Figure 12:
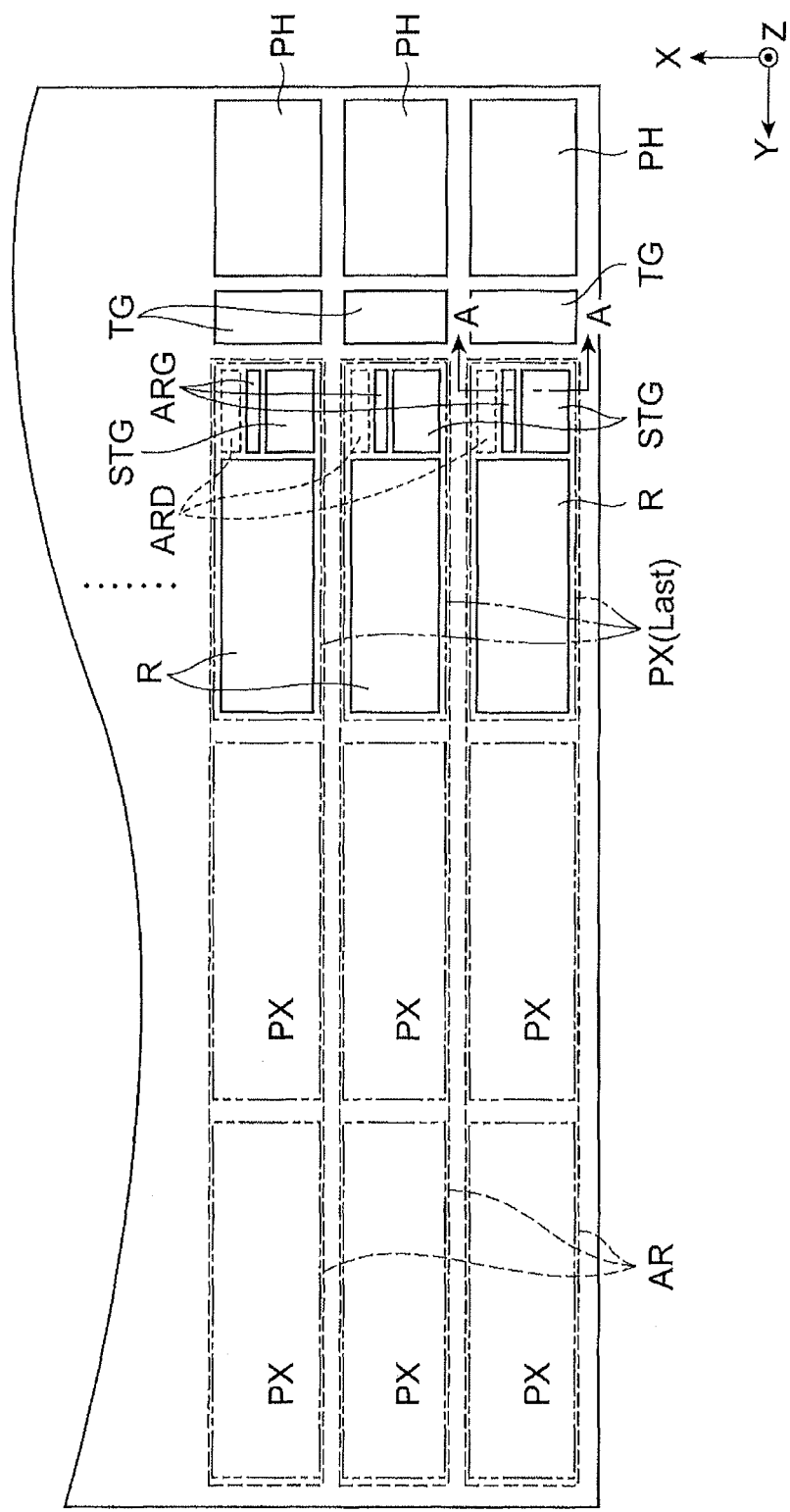
FIG. 12 is a partial plan view of the charge-coupled device for describing the terminal portion of the vertical pixel column.

FIG. 12 is a partial plan view of the charge-coupled device for describing the terminal portion of the vertical pixel column, FIG. 13(A) is a cross-sectional view (A-A arrow cross-section) of the charge-coupled device shown in FIG. 12, and FIGS. 13B and 13C are potential views of the cross section in an X axis direction.

In a terminal of the pixel column made of a plurality of pixel regions PX, the transfer electrode STG, the transfer gate electrode TG, and the horizontal transfer electrode PH described above are formed side by side in a negative direction of the Y axis. A reset gate electrode ARG is formed on the insulation film 20 adjacent to an X axis direction of the transfer electrode STG.

A channel region B2 having an impurity concentration lower than the impurity concentration of the charge accumulation region S2 is formed adjacent to the charge accumulation region S2 directly beneath the reset gate electrode ARG, and a drain region ARD for discharging a charge is formed adjacent to the channel region B2. When a potential lower than a reference potential is given to the reset gate electrode ARG (B), a potential barrier is formed in the channel region B2, and electrons are accumulated in the charge accumulation region S2. However, when a potential higher than the reference potential is given thereto (C), the potential barrier is disappeared and electrons (black circles) flows into the drain region ARD. A timing when a high potential is given to the reset gate electrode ARG, for example, a time when the binning operation is completed, is set according to a desired purpose.

Figure 14:
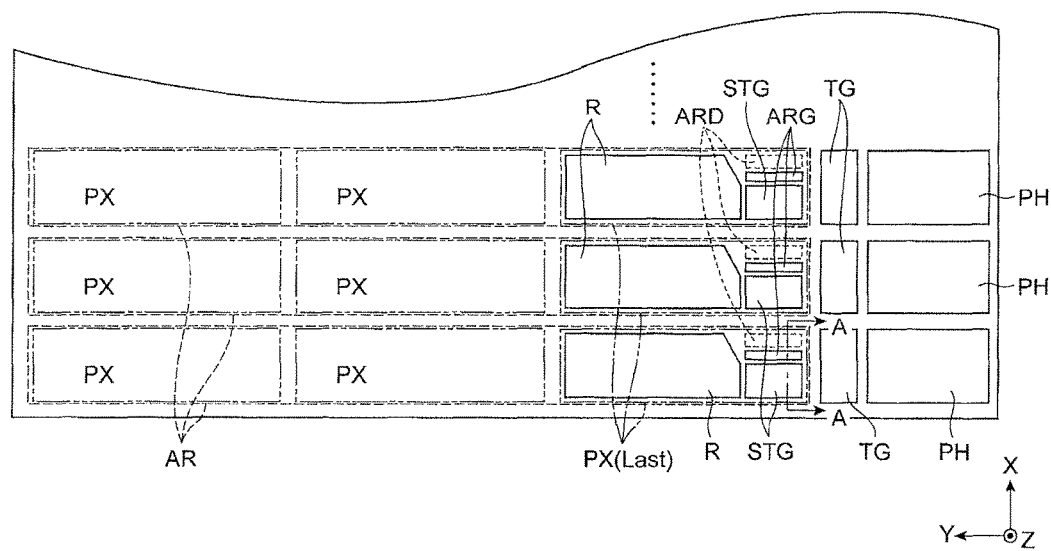
FIG. 14 is a partial plan view of the charge-coupled device when a charge accumulation region in a pixel of a last terminal is deformed.

FIG. 14 is a partial plan view of the charge-coupled device when planar shapes of a resistive gate electrode R and a photoelectric conversion region S1 in a last terminal of a pixel region are deformed. A difference from the structure shown in FIG. 13 is that the planer shapes of the resistive gate electrode R and the photoelectric conversion region S1 in a pixel region PX (last) of a last terminal are different, and the other configurations are the same as in FIG. 12. An XY planar shape of the resistive gate electrode R and the photoelectric conversion region S1 in the pixel region PX (last) of a last terminal has a narrowed width toward the charge transfer direction at the end. The XY planar shapes of the resistive gate electrode R and the photoelectric conversion region S1 are the same as each other, such that only the resistive gate electrode R is shown in the same drawing. Due to this structure, a transferred charge can be transferred to the charge accumulation region S2 directly beneath the transfer electrode STG without being led to the drain region ARD.

Figure 15:
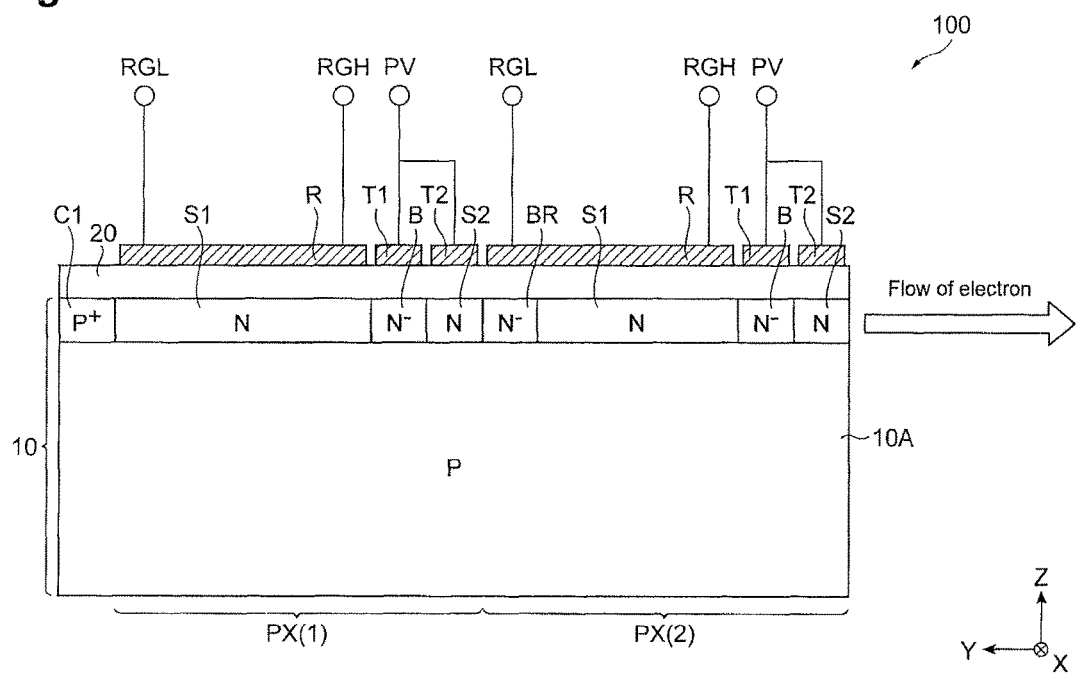
FIG. 15 is a cross-sectional view of a charge-coupled device according to a modified structure.
Figure 16:
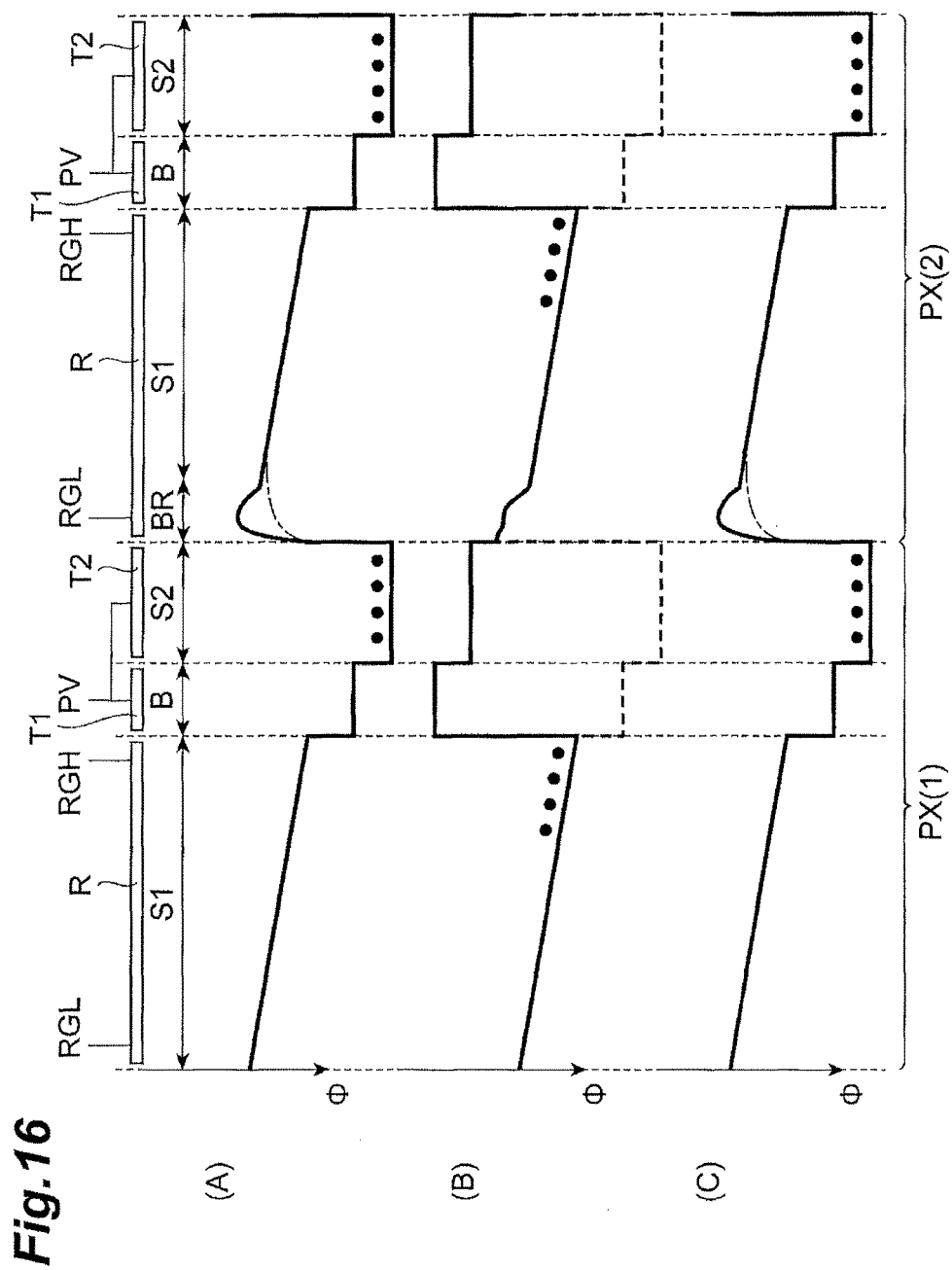
FIG. 16 is a view for describing a potential change in the vertical pixel column.

FIG. 15 is a cross-sectional view of a charge-coupled device according to a modified structure, and FIG. 16 is a view for describing a potential change in the vertical pixel column. A difference between a structure shown in FIG. 15 and a structure shown in FIG. 2 is that a potential barrier region BR of a low impurity concentration is provided on a front stage side of the photoelectric conversion region in the charge transfer direction, and the other configuration are the same as each other.

In other words, the potential barrier region BR having a lower impurity concentration than the photoelectric conversion region S1 is formed between the charge accumulation region S2 in a certain pixel region PX(1) and the photoelectric conversion region S1 in a pixel region PX(2) adjacent to a rear stage of the pixel region PX(1). In this manner, when there is a potential barrier region BR having a low impurity concentration, it is possible to prevent a charge from reversely flowing to the charge accumulation region S2 of a target pixel region from the pixel region PX(2) of the rear stage.

That is, (A), (B), and (C) of FIG. 16 are views corresponding to states of (A), (B), and (C) of FIG. 4, respectively. The potential barrier region BR suppresses an unnecessary transfer of electrons to a pixel region PX(2) of a next stage in a state of (A), and moreover, when returned to a state of (A) from a state of (C), the potential barrier region BR prevents electrons from reversely flowing.

Figure 17:
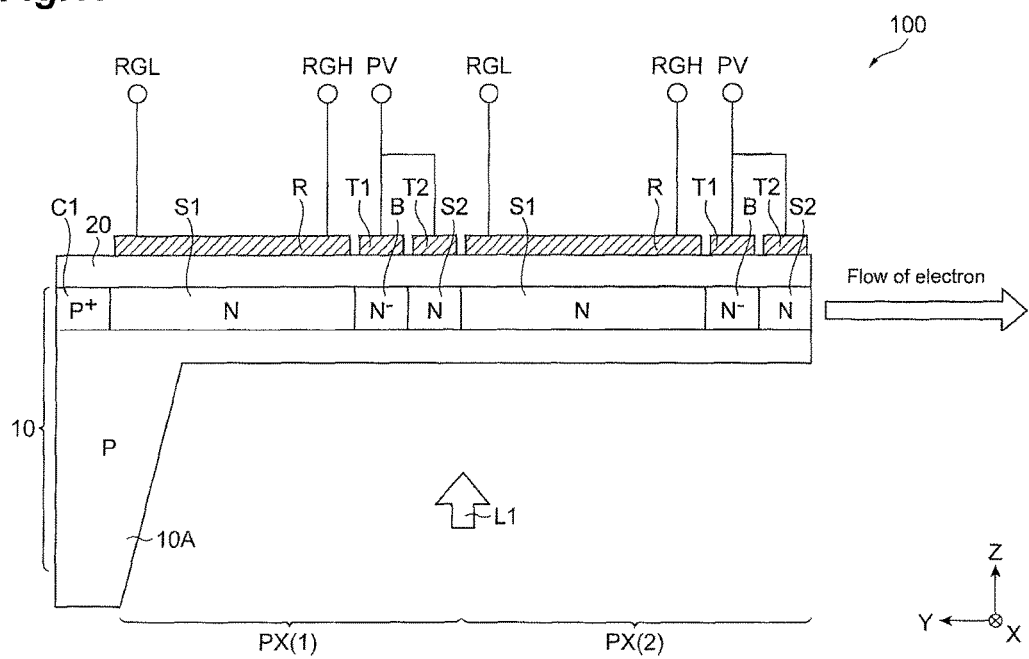
FIG. 17 is a partial cross-sectional view of a back-side illuminated charge-coupled device.

FIG. 17 is a partial cross-sectional view of a back-side illuminated charge-coupled device.

A difference from the structure shown in FIG. 2 of the embodiment is that the semiconductor substrate main body 10A is configured to be thin from a rear surface side and causes an incident light L1 to be incident from the rear surface. A thickness of a peripheral portion of the semiconductor substrate main body 10A is set to be thicker than a thickness of a central portion, and the thickness of the central portion is set to be, for example, 5 µm to 100 µm. Accordingly, since there is no electrode to block light incident on the photoelectric conversion region S1 from the rear surface side, high sensitivity imaging becomes possible.

Figure 18:
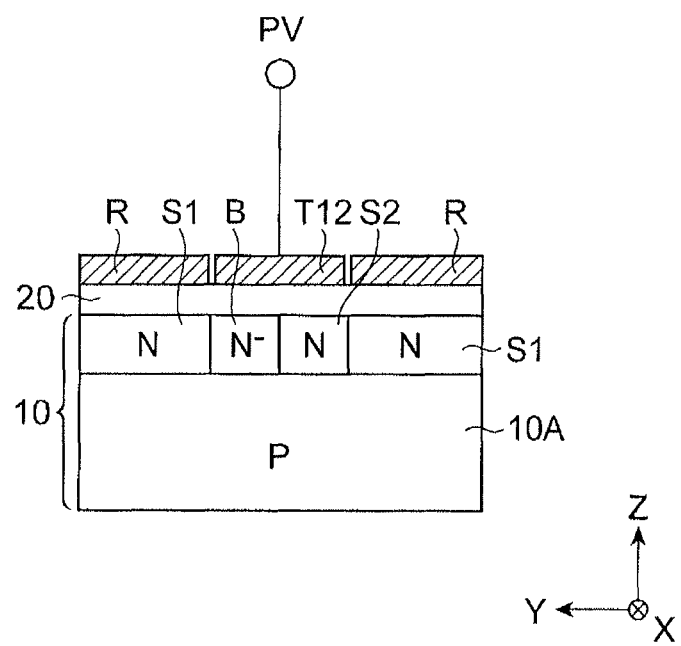
FIG. 18 is a cross-sectional view near a transfer electrode of a charge-coupled device when the transfer electrode is shared.

FIG. 18 is a cross-sectional view of a vicinity of a transfer electrode of a charge-coupled device when the first transfer electrode T1 and the second transfer electrode T2 are shared in each pixel region PX.

That is, in the embodiment, the first transfer electrode T1 and the second transfer electrode T2 are configured from one common electrode T12, and the other structures are the same as in the embodiment described above. In this case, there is an effect that the structure is simplified.

In particular, in a method of manufacturing a charge-coupled device including the common transfer electrode T12 or STG, the barrier region B can be formed by adding P-type (first conductivity type) impurities to an N-type (second conductivity type) semiconductor region and then performing a carrier compensation. In other words, the barrier region B is formed by adding impurities that form the photoelectric conversion region S1 on a surface of the semiconductor substrate 10, and then performing the carrier compensation by partially adding an impurity of a conductivity type opposite to the semiconductor region S formed by the addition. That is, due to the carrier compensation, it is possible to easily form a barrier region B of a low concentration. Hereinafter, this will be described in detail.

Figure 19:
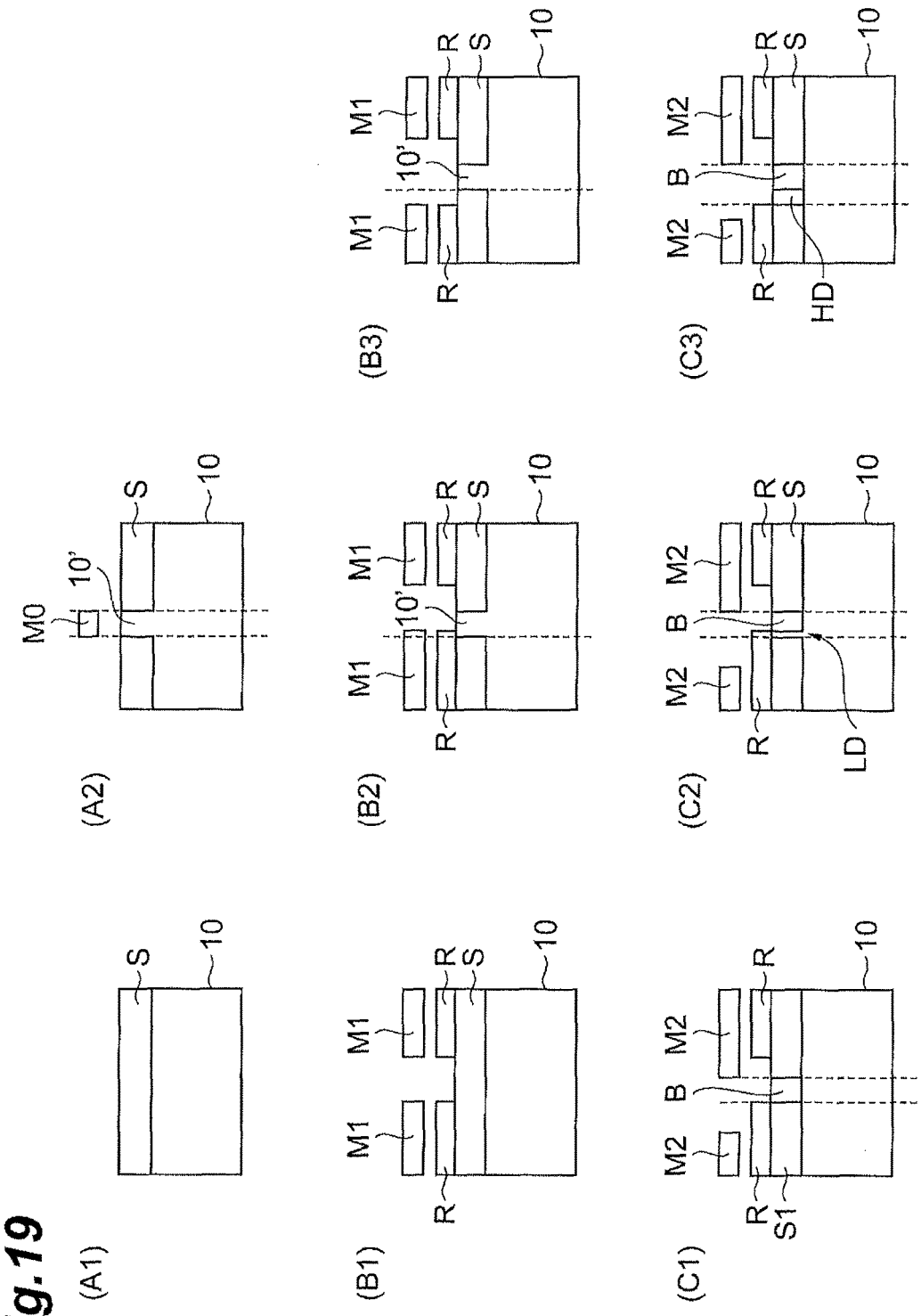
FIG. 19 is a view for describing implantation of impurities.

FIG. 19 is a view for describing a method of implanting impurities.

First, N-type impurities are added to an entire surface of a P-type semiconductor substrate 10 by an ion implantation, and an N-type semiconductor region S is formed (A1). Next, a resistive layer R made of poly-silicon and the like is formed on the N-type semiconductor region S. A sputtering method and the like can be used in the formation. Next, a mask M1 having an opening is formed on the resistive layer R, and the resistive layer R is etched to be patterned using the mask M1 (B1). Moreover, another mask M2 is prepared, an opening position of the resistive layer R and an opening position of the mask M2 are shifted, the mask M2 is disposed so as to overlap only a portion of the opening of the resistive layer, the P-type impurities are implanted and added in the N-type semiconductor region S using an opening edge of the mask M2 and an opening edge (self-alignment) of the resistive layer R, and a carrier of the added region is compensated to form the barrier region B described above (C1). In addition, the insulation film 20 on the semiconductor substrate is formed prior to a formation of the resistive layer R, and the resistive layer and the above-mentioned electrode are patterned on the insulation film 20 in a usual method, but this is not described in FIG. 19.

Furthermore, the barrier region B can be also formed by using a method of not performing the carrier compensation, but in this case, since self-alignment due to the opening of the resistive layer cannot be used, positional accuracy in the formation of the barrier region is not high compared with the method of using the carrier compensation.

In a case of the method of not using the carrier compensation, first, a mask M0 is disposed on a surface side of the p-type semiconductor substrate 10, and the N-type impurities are implanted and added to form the N-type semiconductor region S (A2). Impurities are not added to a region 10' directly beneath the mask M0. Next, the resistive layer R made of poly-silicon and the like is formed on an entire surface of the semiconductor substrate 10, the mask M1 having an opening is disposed on the resistive layer R, and the resistive layer R is etched using the mask M1 to perform a patterning. In this case, the opening position of the patterned resistive layer R and the region 10' in which impurities are not added to the surface of the semiconductor substrate 10 are slightly shifted due to alignment accuracy of the mask M1.

Next, another mask M2 is prepared, the opening position of the resistive layer R and the opening position of the mask M2 are shifted, the mask M2 is disposed so as to overlap only a portion of the opening of the resistive layer, and N-type impurities of low concentration are implanted and added in the P-type region 10' rather than the n-type semiconductor region to form the n-type barrier region B using an opening of the mask M2 and an opening (self-alignment) of the resistive layer R. In this case, a position of the barrier region B is not as accurate in the above method.

That is, in the above process (B2), when a position of a left edge of the opening of the mask M1 is further shifted to the right side from a left edge of the region 10', a region LD to which the N-type impurities are not added is formed on a left side of the barrier region B as shown in (C2).

On the other hand, in the above process (B2), when the position of a left edge of an opening of the mask M1 is further shifted to the left side from the left edge of the region 10' (indicated as (B3)), a region HD to which the N-type impurities are added at a high concentration is formed on the right side of the barrier region B as shown in (C3).

Finally, materials will be described.

The semiconductor substrate 10 described above is made of silicon (Si), the N-type impurities added to the barrier region and the charge accumulation region can be set to be N, P, or As, and the P-type impurities can be set to be B or Al. Preferred values of impurity concentration and thickness of each element are as follows.

Semiconductor substrate main body 10A:
$10^{13}$ to $10^{19}$ (cm$^{-3}$)/50000 to 800000 (nm)
Photoelectric conversion region S1:
$10^{12}$ to $10^{17}$ (cm$^{-3}$)/100 to 5000 (nm)
Barrier region B:
$10^{11}$ to $10^{17}$ (cm$^{-3}$)/100 to 5000 (nm)
Charge accumulation region S2:
$10^{12}$ to $10^{17}$ (cm$^{-3}$)/100 to 5000 (nm)
Region S11:
$10^{12}$ to $10^{18}$ (cm$^{-3}$)/100 to 5000 (nm)
Region S12:
$10^{13}$ to $10^{19}$ (cm$^{-3}$)/100 to 5000 (nm)
Region S11*:
$10^{12}$ to $10^{18}$ (cm$^{-3}$)/100 to 5000 (nm)
Region S12*:
$10^{13}$ to $10^{19}$ (cm$^{-3}$)/100 to 5000 (nm)
Region S12**:
$10^{13}$ to $10^{19}$ (cm$^{-3}$)/100 to 5000 (nm)
Taper Region S12*:
$10^{12}$ to $10^{18}$ (cm$^{-3}$)/100 to 5000 (nm)
Channel region B2:
$10^{11}$ to $10^{17}$ (cm$^{-3}$)/100 to 5000 (nm)
Drain region ARD:
$10^{17}$ to $10^{20}$ (cm$^{-3}$)/100 to 5000 (nm)
Potential barrier region BR:
$10^{11}$ to $10^{17}$ (cm$^{-3}$)/100 to 5000 (nm)

INDUSTRIAL APPLICABILITY

Reference Signs List

10 Semiconductor substrate
B Barrier region

S1 Photoelectric conversion region
S2 Charge accumulation region
Reference to Deposited Biological Material

The invention claimed is:
1. A charge-coupled device comprising:
a semiconductor substrate including a plurality of pixel regions aligned in one direction; and
an insulation film provided on the semiconductor substrate,
wherein each pixel region includes
a photoelectric conversion region which performs photoelectric conversion on an incident energy beam,
a resistive gate electrode provided on the insulation film on the photoelectric conversion region, wherein a predetermined fixed voltage is applied between the ends of the resistive gate electrode;
a first transfer electrode provided on the insulation film,
a second transfer electrode provided on the insulation film and disposed between the first transfer electrode and a pixel region adjacent to the pixel region,
a barrier region positioned directly beneath the first transfer electrode in the semiconductor substrate, and
a charge accumulation region positioned directly beneath the second transfer electrode in the semiconductor substrate, an impurity concentration of the barrier region is lower than an impurity concentration of the charge accumulation region, and the first transfer electrode and the second transfer electrode are electrically connected to each other,
wherein a potential barrier region having a lower impurity concentration than the photoelectric conversion region is formed between the charge accumulation region in a pixel region and the photoelectric conversion region in a pixel region adjacent to a rear stage of the pixel region.

2. The charge-coupled device according to claim 1, wherein the first transfer electrode and the second transfer electrode are configured from one common electrode.

3. A solid-state imaging element comprising:
the charge-coupled device according to claim 1;
a drive circuit for driving the charge-coupled device; and
a controller for controlling the drive circuit,
wherein the controller controls the drive circuit so that potentials of the first and the second transfer electrodes vertically vibrate at the same time.

4. A method of manufacturing the charge-coupled device according to claim 2,
wherein the barrier region is formed by adding impurities which form the photoelectric conversion region to a surface of the semiconductor substrate, and performing a carrier compensation by partially adding impurities of a conductivity type opposite to the semiconductor region which is formed by the addition.

* * * * *